(12) United States Patent
Yamada

(10) Patent No.: US 8,405,474 B2
(45) Date of Patent: Mar. 26, 2013

(54) PIEZOELECTRIC VIBRATION PIECE AND PIEZOELECTRIC DEVICE

(75) Inventor: Yoshiyuki Yamada, Minowa (JP)

(73) Assignee: Seiko Epson Corporation (JP)

( * ) Notice: Subject to any disclaimer, the term of this patent is extended or adjusted under 35 U.S.C. 154(b) by 81 days.

(21) Appl. No.: 13/178,197

(22) Filed: Jul. 7, 2011

(65) Prior Publication Data

US 2011/0260587 A1 Oct. 27, 2011

Related U.S. Application Data

(63) Continuation of application No. 12/643,290, filed on Dec. 21, 2009, now Pat. No. 7,999,637, which is a continuation of application No. 11/387,101, filed on Mar. 22, 2006, now Pat. No. 7,659,798.

(30) Foreign Application Priority Data

Mar. 22, 2005 (JP) ................................. 2005-081501

(51) Int. Cl.
*H03H 9/21* (2006.01)
(52) U.S. Cl. ........................................ 333/200; 310/370
(58) Field of Classification Search .................. 333/200; 310/365, 366, 370
See application file for complete search history.

(56) References Cited

U.S. PATENT DOCUMENTS

| 7,253,554 B2 | 8/2007 | Dalla Piazza et al. |
| 7,279,824 B2 | 10/2007 | Tanaya et al. |
| 7,368,861 B2 | 5/2008 | Tanaya |
| 7,659,798 B2 | 2/2010 | Yamada |
| 7,999,637 B2 * | 8/2011 | Yamada ....................... 333/200 |
| 2002/0089386 A1 | 7/2002 | Kitamura et al. |
| 2004/0245894 A1 | 12/2004 | Tanaya et al. |

FOREIGN PATENT DOCUMENTS

JP 2002-076827 3/2002

* cited by examiner

*Primary Examiner* — Barbara Summons
(74) *Attorney, Agent, or Firm* — Harness, Dickey & Pierce, P.L.C.

(57) ABSTRACT

A piezoelectric vibration piece includes a base made of a piezoelectric material; a plurality of vibration arms which is integrally formed with the base and extends in parallel; elongate grooves which are formed along longitudinal directions of the vibration arms; and excitation electrodes which include inner electrodes disposed in the elongate grooves and side electrodes disposed in side surfaces facing the inner electrodes, wherein widening portions in which the widths of the vibration arms are widened toward the base at a joint between the vibration arms of the base are formed, and the side electrodes are led to principal surfaces and side surfaces of the widening portions.

6 Claims, 5 Drawing Sheets

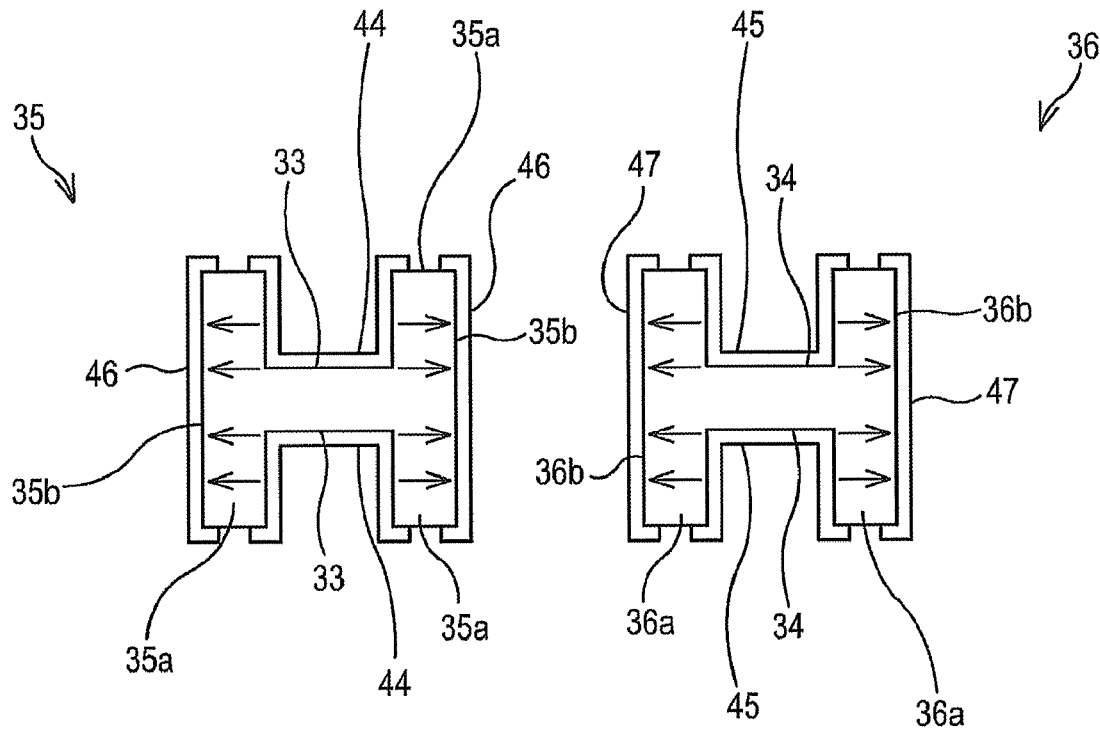
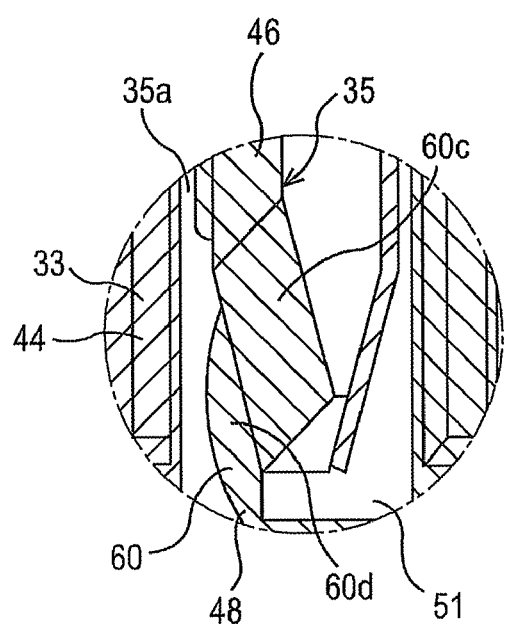

PRIOR ART

PRIOR ART

PIEZOELECTRIC VIBRATION PIECE AND PIEZOELECTRIC DEVICE

CROSS-REFERENCE TO RELATED APPLICATIONS

This application is a continuation application of U.S. Ser. No. 12/643,290 filed Dec. 21, 2009, now U.S. Pat. No. 7,999,637, which is a continuation application of U.S. Ser. No. 11/387,101 filed Mar. 22, 2006, now U.S. Pat. No. 7,659,798, claiming priority to Japanese Patent Application No. 2005-081501 filed Mar. 22, 2005, all of which are incorporated by reference herein.

BACKGROUND

1. Technical Field

The present invention relates to improvement of a piezoelectric vibration piece and a piezoelectric device which receives the piezoelectric vibration piece in a package or a case.

2. Related Art

FIG. 7 is a schematic plan view illustrating an example of a piezoelectric vibration piece which has been conventionally used in a piezoelectric device and FIG. 8 is a schematic cross-sectional view taken along line A-A of FIG. 7.

In Figures, a piezoelectric vibration piece 1 is formed to have an illustrated outer shape by etching a piezoelectric material such as quartz and includes a rectangular base 2 and a pair of vibration arms 3 and 4 which extends from the base 2 to a right side of FIG. 7. Elongate grooves 3a and 4a are formed in principal surfaces (front/rear surfaces) of the vibration arms.

In other words, electrodes 5 and 6 applied with driving voltages to have opposite polarities are provided in the base 2.

The electrode 5 is led to an inner surface of the elongate groove 3a provided in the vibration arm 3 and a side surface 4b facing an inner surface of the elongate groove 4a of the vibration arm 4.

The electrode 6 is led to the inner surface of the elongate groove 4a provided in the vibration arm 4 through a side electrode 6a provided in a side surface 3b facing the inner surface of the elongate groove 3a of the vibration arm 3 and a base electrode 6b provided in a principal surface of the base 2 such that the electrode 6 is not short-circuited to the electrode 5.

In addition, since an electrode must not be provided in a crotch portion 2a between the vibration arms 3 and 4, leading the side electrode 6a to the base electrode 6b is accomplished by forming an electrode 6c connected to the side electrode 6a on the principal surface (front/rear surface) of a sidewall 3c of the vibration arm 3 and connecting the electrode 6c to the base electrode 6b.

An electric field can be generated between the electrodes provided in the inner surfaces of the elongate grooves 3a and 4a and the electrodes provided in the side surfaces 3b and 4b of the vibration arms 3 and 4 to reduce a crystal impedance value (hereinafter, referred to as "CI value"). Thus, it is possible to miniaturize the piezoelectric vibration piece.

However, in the miniaturized piezoelectric vibration piece, the above-mentioned leading of the electrodes is not facilitated. In particular, since the width W1 of the sidewall 3c of the vibration arm 3 is very small, it is difficult to form the electrode 6c on the principal surface of the sidewall 3c, without coming into contact with the electrode provided in the inner surface of the elongate groove 3a.

Accordingly, a piezoelectric vibration piece 10 illustrated in FIG. 9 which is a partial enlarged view illustrating the periphery of a root of a vibration arm was suggested (for example, JP-A-2002-76827).

In the piezoelectric vibration piece 10, since the width W2 of an elongate groove 13 located at a joint of a vibration arm 14 is less than the width W3 of the front end of the elongate groove 13, it is possible to surely form an electrode 12 on a sidewall without coming into contact with an electrode provided in the inner surface of the elongate groove 13 by the smaller width.

However, since a recent piezoelectric vibration piece has been newly miniaturized, it is difficult to accurately form an electrode on a principal surface of a sidewall having a very small width in a vibration arm. For example, since the width of the electrode 6c of the principal surface of the sidewall 3c illustrated in FIG. 7 is at most 3 μm, the electrode 6c may not be formed on the principal surface of the sidewall 3c and thus the electrode 6c and the electrode 6b on the base 2 may not be connected to each other. Although the electrode 6c can be accurately formed on the principal surface of the sidewall 3c, the electrode 6c on the principal surface of the sidewall and the electrode 6b on the base 2 may be disconnected from each other due to slight deviation of a position of the electrode 6b on the base 2 connected to the electrode 6c.

In addition, according to the recent miniaturization of the piezoelectric vibration piece, disconnection may occur even in the piezoelectric vibration piece 10 illustrated in FIG. 9. For example, a position of the electrode 12 on the principal surface of the sidewall is deviated from a position 12a indicated by a dotted line of FIG. 9 and thus the electrode 12 on the principal surface of the sidewall may be disconnected from the side electrode 11.

Moreover, although the position of the electrode 12 on the principal surface of the sidewall is slightly deviated, the disconnection between the side electrode 11 and the electrode 12 on the sidewall can be avoid by more decreasing the width W2 of the elongate groove 13 illustrated in FIG. 9 and more increasing the width of the electrode 12 on the principal surface of the sidewall. However, when the width W2 of the elongate groove 12 is too small, the CI value increases.

SUMMARY

Accordingly, it is an advantage of the present invention to provide a piezoelectric vibration piece and a piezoelectric device using the piezoelectric vibration piece, which can prevent electrodes from being disconnected from each other while preventing the electrodes from being short-circuited and can suppress a CI value to a low value, although the piezoelectric vibration piece is miniaturized.

According to a first aspect of the invention, there is provided a piezoelectric vibration piece including a base made of a piezoelectric material; a plurality of vibration arms which is integrally formed with the base and extends in parallel; elongate grooves which are formed along longitudinal directions of the vibration arms; and excitation electrodes which include inner electrodes disposed in the elongate grooves and side electrodes disposed in side surfaces facing the inner electrodes, wherein widening portions in which the widths of the vibration arms are widened toward the base at a joint between the vibration arms of the base are formed, and the side electrodes are led to principal surfaces and side surfaces of the widening portions.

According to the first aspect, since the widening portion in which the widths of the vibration arms are widened toward the base at the joint between the vibration arms of the base are formed, when the vibration arms are bent and vibrated, largest stress is applied and rigidity of the joint in which distortion increases can be improved. Accordingly, the bending vibration of the vibration arms becomes stable and a vibration component in an unnecessary direction is suppressed, thereby suppressing a CI value to a low value.

In addition, the side electrodes are led to the principal sides and the side surfaces of the widening portions. Accordingly, although the electrode on the principal surface of the sidewall of the vibration arm and the electrode on the base do not come into contact with each other, the side electrode and the electrode on the base can be connected to each other through the electrode led to the principal surfaces and the side surfaces of the widening portions.

Moreover, since the side electrode and the electrode on the base can be connected to each other without paying attention to the width of the electrode of the principal surface of the sidewall of the vibration arm, the width of the electrode of the principal surface of the sidewall of the vibration arm may be decreased or the electrode of the principal surface of the sidewall of the vibration arm may not be formed. Accordingly, it is possible to prevent the electrode of the principal surface of the sidewall of the vibration arm from coming into contact with inner electrode in the elongate groove.

Accordingly, even when the piezoelectric vibration piece is miniaturized, it is possible to provide a piezoelectric vibration piece which can prevent disconnection between electrodes while preventing short-circuiting between the electrodes and can suppress the CI value to a low value.

According to a second aspect of the invention, the widths of the widening portions may be widened toward the base while a widening degree step is changed by step.

According to the second aspect, since the widths of the widening portions is widened toward the base while a widening degree step is changed by step, the contact length between the side surface of the widening portion and the principal surface of the widening portion more increases, compared with a case where the widening degree is not changed. Accordingly, it is possible to prevent the disconnection between the side surface of the widening portion and the principal surface of the widening portion.

According to a third aspect of the invention, there is provided a piezoelectric device which receives a piezoelectric vibration piece in a package or a case, the piezoelectric vibration piece including a base made of a piezoelectric material; a plurality of vibration arms which is integrally formed with the base and extends in parallel; elongate grooves which are formed along longitudinal directions of the vibration arms; and excitation electrodes which include inner electrodes disposed in the elongate grooves and side electrodes disposed in side surfaces facing the inner electrodes, wherein widening portions in which the widths of the vibration arms are widened toward the base at a joint between the vibration arms of the base are formed, and the side electrodes are led to principal surfaces and side surfaces of the widening portions.

According to the third aspect, it is possible to a piezoelectric device which can prevent electrodes from being disconnected from each other while preventing the electrodes from being short-circuited and can suppress a CI value to a low value.

BRIEF DESCRIPTION OF THE DRAWINGS

The invention will be described with reference to the accompanying drawings, wherein like numbers reference like elements.

FIG. 4 is a cross-sectional view taken along line C-C of FIG. 3.

FIG. 5 is a partial view illustrating the periphery of a root of a vibration arm of the piezoelectric vibration piece according to the invention.

DESCRIPTION OF EXEMPLARY EMBODIMENTS

Figure 1:
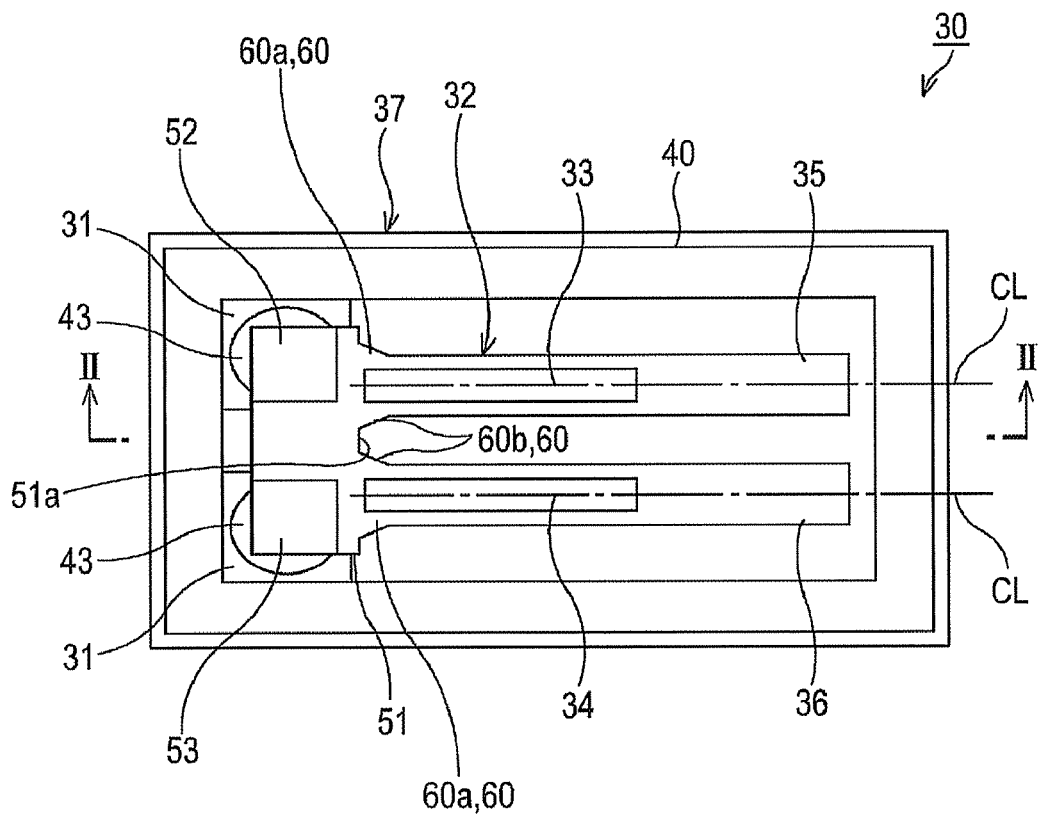
FIG. 1 is a schematic plan view illustrating a piezoelectric device according to an embodiment of the invention.
Figure 2:
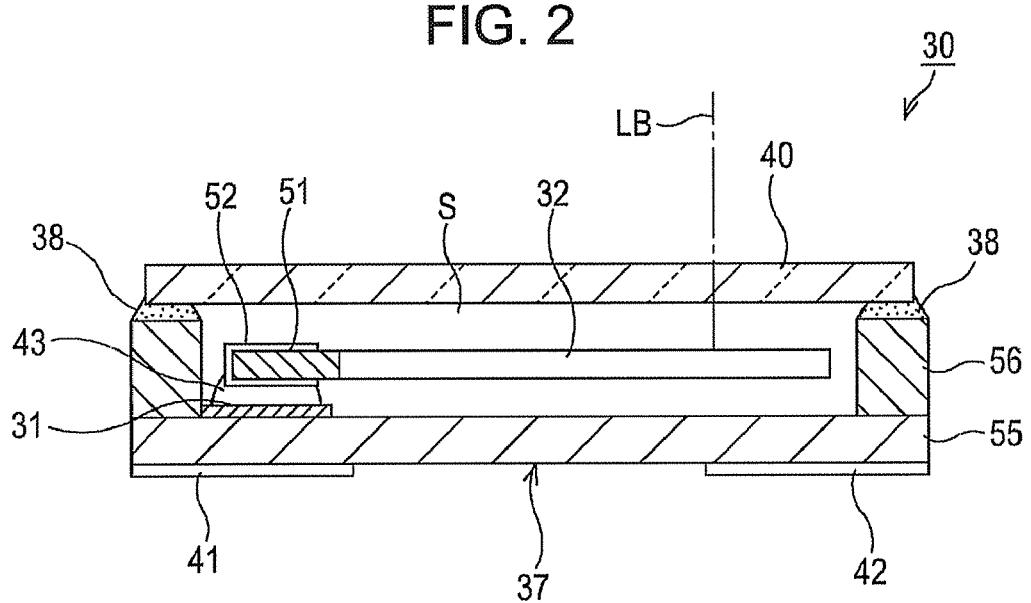
FIG. 2 is a schematic cross-sectional view taken along line B-B of FIG. 1.
Figure 3:
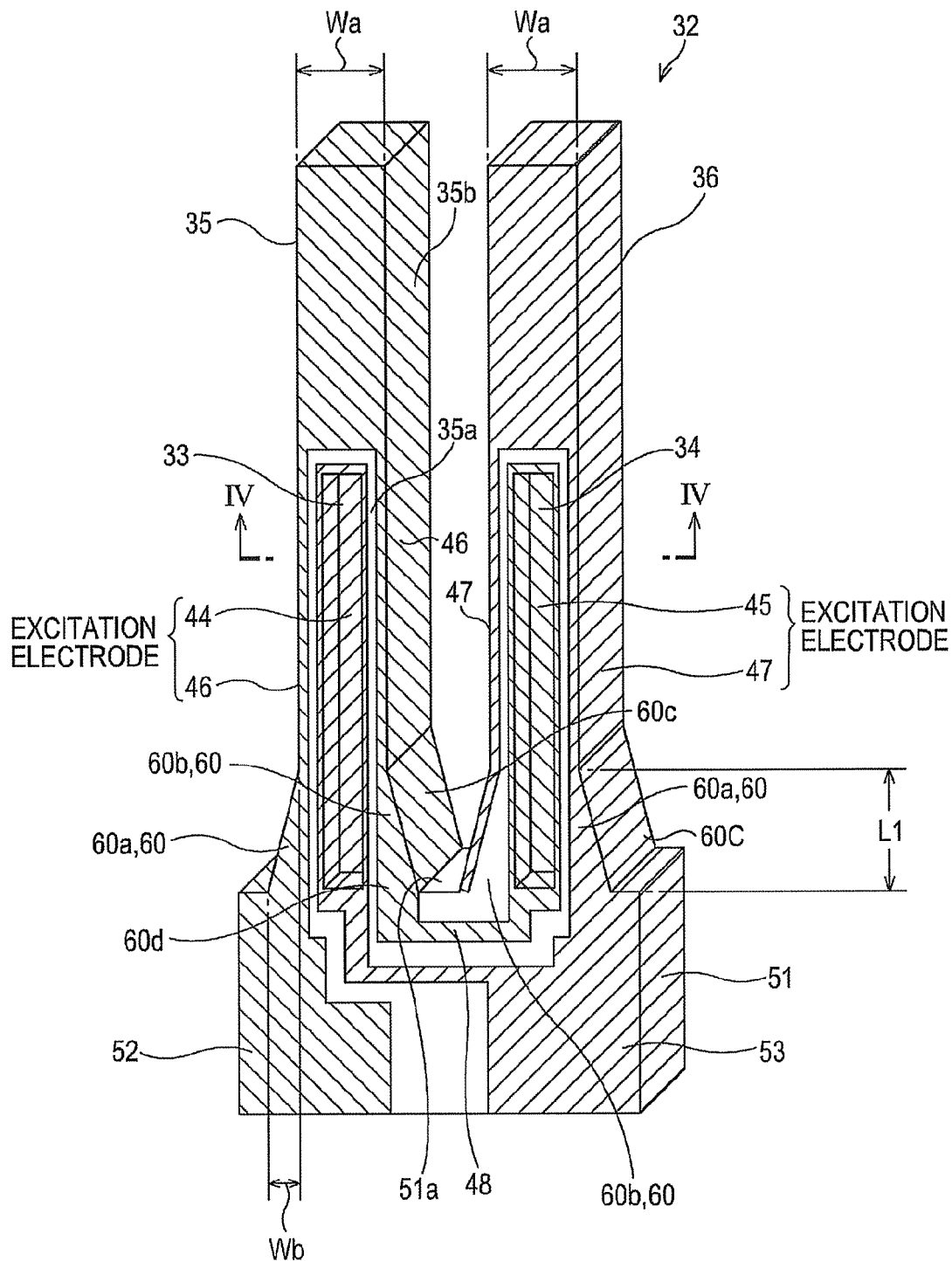
FIG. 3 is a schematic perspective view illustrating a piezoelectric vibration piece used in the piezoelectric device of FIG. 1.

FIGS. 1 to 4 illustrate a piezoelectric device according to an embodiment of the invention, wherein FIG. 1 is a schematic plan view thereof, FIG. 2 is a schematic cross-sectional view taken along line B-B of FIG. 1, FIG. 3 is a schematic perspective view illustrating a piezoelectric vibration piece used in the piezoelectric device of FIG. 1, and FIG. 4 is a cross-sectional view taken along line C-C of FIG. 3.

In addition, in FIGS. 1 and 2, for purposes of understanding, excitation electrodes are not illustrated. Furthermore, the parallel oblique lines of FIG. 3 illustrate an electrode, not a cross section.

In the drawings, a piezoelectric device 30 illustrates an example configuring a piezoelectric vibrator. The piezoelectric device 30 receives a piezoelectric vibration piece 32 in a package 37, as illustrated in FIGS. 1 and 2. The package 37 is formed by laminating a first substrate 55 and a second substrate 56, as illustrated in FIG. 2, and is, for example, formed by molding and sintering a ceramic green sheet made of aluminum oxide in an illustrated shape using an insulating material.

In the package 37, an inner space S is formed by removing an inner material of the second substrate 56, as illustrated in FIG. 2. The inner space S receives a piezoelectric vibration piece 32. In addition, on electrode portions 31 and 31 formed on the first substrate 55, lead electrodes 52 and 53 provided on a base 51 of the piezoelectric vibration piece 32 are bonded using conductive adhesives 43 and 43. Furthermore, the electrode portions 31 and 31 are connected to mounting terminals 41 and 42 on a rear surface of the package through conductive through-holes.

Moreover, after the piezoelectric vibration piece 32 is received, the package 37 is hermetically sealed by bonding a cover 40 made of transparent glass using a sealing material 38. Accordingly, after sealing the cover 40, laser light LB is irradiated to trim the electrodes of the piezoelectric vibration piece 32, thereby performing frequency regulation.

The piezoelectric vibration piece 32 is made of a piezoelectric material such as quartz, lithium tantalate, or lithium niobium acid. As illustrated in FIG. 3, the piezoelectric vibration piece 32 includes a base 51 and a pair of vibration arms 35 and 36 which bisects and extends from the base 51 to an upper side of FIG. 3 in parallel.

In addition, a tuning-fork outer shape of the piezoelectric vibration piece 32 and elongate grooves provided in the vibration arms can be formed by wet-etching a material such as a quartz wafer using fluoric acid solution and dry-etching the material such as the quartz wafer.

The base 51 supports the vibration arms 35 and 36 and includes a region fixed to the package 37 in the present embodiment.

In other words, the plurality of lead electrodes 52 and 53 connected to the mounting terminals 41 and 42 (see FIG. 2) and having opposite polarities are provided on the both ends of the base 51 in a width direction. The lead electrodes 52 and 53 deliver driving voltages to the excitation electrodes and are formed by sputtering, for example, chrome (Cr) and gold (Au).

The vibration arm 35 and the vibration arm 36 have the substantially same outer shape, and elongate grooves 33 and 34 which extend on the principal surfaces (the front/rear surfaces) in a longitudinal direction are formed, respectively. Thus, as illustrated in FIG. 4, the cross section of the vibration arms has substantially an H shape.

As illustrated in FIGS. 3 and 4, in the vibration arms 35 and 36, the excitation electrodes, which are driving electrodes, are formed by inner electrodes 44 and 45 disposed in inner surfaces of the elongate grooves 33 and 34 and side electrodes 46 and 47 disposed in side surfaces 35b and 36b facing the inner electrodes 44 and 45. In other words, the inner electrode 44 and the side electrode 46 face each other and the inner electrode 45 and the side electrode 47 face each other. The inner electrodes 44 and 45 and the side electrodes 46 and 47 are connected to the lead electrodes 52 and 53 on the base 51 to have opposite polarities. The excitation electrodes are formed by sputtering, for example, chrome (Cr) and gold (Au).

Accordingly, when the piezoelectric device 30 is mounted on a mounting substrate, an external driving voltage is delivered from the mounting terminals 41 and 42 to the respective excitation electrodes of the vibration arms 35 and 36 through the lead electrodes 52 and 53. At this time, by applying driving voltages to the inner electrodes 44 and 45 and the side electrodes 46 and 47 facing thereto, it is possible to improve electric field efficiency in a region in which the excitation electrodes are formed in the elongate grooves 33 and 34 of the respective vibration arms.

In addition, the inner electrodes 44 and 45 and the side electrode 46 and 47 are preferably connected to the lead electrodes 52 and 53 to have opposite polarities as follows.

First, the lead electrode 53 is connected to the inner electrode 44 of the elongate groove 33 through the principal surface (front/rear surface) of the base 51 and to the side electrode 47 provided in the side surfaces 36b facing the inner electrode 45 of the vibration arm 36.

The lead electrode 52 is connected to the inner electrode 45 of the vibration arm 35 by rounding the front end and the side surface 35b of the vibration arm 35 to be not connected to the lead electrode 53 and the electrode of the principal surface of the base 51, the inner electrode 44, and the side electrode 47 connected to the lead electrode 53.

In other words, the lead electrode 52 is connected to the side electrode 46 on the side surface 35b of the vibration arm 35 and the side electrode 46 is connected to the inner electrode 45 in the elongate groove 34 of the vibration arm 35 through a connection electrode 48 of the principal surface (front/rear surface) of the base 51.

When the side electrode 46 is connected to the connection electrode 48 of the base 51, the side electrode 46 is not covered by a crotch portion 51a located between the vibration arm 35 and the vibration arm 36 of the base 51 such that an electric field is not generated in the crotch portion 51a.

Here, the piezoelectric vibration piece 32 according to the present embodiment has widening portions 60 and 60 in which widths Wa of the vibration arms 35 and 36 are widened toward the base 51 at a joint between the vibration arms 35 and 36 of the base 51.

As illustrated in FIG. 1, the widening portions 60 and 60 are preferably formed such that an outer widening portion 60a and an inner widening portion 60b (at a side of the crotch portion 51a) are symmetrical with respect to an imaginary line CL along a longitudinal direction passing through a center of the vibration arms 35 and 36 in the width direction, when viewed in a plan view. Accordingly, the inner sides and the outer sides of the vibration arms 35 and 36 are balanced and stable bending vibration can be accomplished.

In particular, the widening portion 60 is inclined such that the width of a root portion is inclined from the front end to the base 51 without changing a widening degree when viewed in the plan view. As illustrated in FIG. 3, the side surface 60c is inclined by a uniform angle.

In addition, the larger a maximum width Wb of a position contacting the base 51, the easier the electrodes are led, as mentioned above. Accordingly, the widening portion 60 is widened to have a width greater than the width of the sidewall 35a formed by providing at least the elongate groove 33. When the maximum width Wb of the widening portion 60 is too large, the crotch portion 51a is eliminated and thus the widening portion 60 functions as the crotch portion. In order to avoid the widening portion 60 from functioning as the crotch portion, the width of the crotch portion 51a may increase, and, in this case, the whole width of the piezoelectric vibration piece 32 increases. Accordingly, in order to leave the crotch portion 51a, the widening portion 60 is formed such that the maximum width Wb is about 23 μm. In addition, the length L1 of the widening portion 60 is 50 μm which is two times of the maximum width Wb.

Moreover, the side electrodes 46 and 47 are led to the side surfaces 60c, 60c, 60c, and 60c of the widening portions 60, 60, 60, and 60. Furthermore, in the plurality of widening portions, the side electrode 46 is led to the principal surface (front/rear surface) of the widening portion 60b in the vibration arm 35.

In other words, as mentioned above, the lead electrode 52 rounds the side surface and the front end of the vibration arm 35 to form the side electrode 46, and the side electrode 46 is led to the principal surface of the base 51 to form the connection electrode 48 connected to the inner electrode 45 of the vibration arm 36 on the base 51, such that the lead electrode 52 and the excitation electrode electrically connected thereto, and the lead electrode 53 and the excitation electrode electrically connected thereto come into contact with each other. Accordingly, when the side electrode 46 is led to the connection electrode 48 on the base 51, the principal surface 60d and the side surface 60c of the widening portion 60b are used.

The present embodiment of the invention is configured as mentioned above, and the piezoelectric vibration piece 32 has the widening portions 60 and 60 in which the widths Wa of the vibration arms 35 and 36 are widened toward the base 51 at the joint between the vibration arms 35 and 36 of the base 51. To this end, when the vibration arms 35 and 36 are bent and vibrated, largest stress is applied and rigidity of the joint in which distortion is large can be improved. Accordingly, the bending vibration of the vibration arms 35 and 36 becomes stable and a vibration component in an unnecessary direction (for example, a thickness direction of the vibration arm) is suppressed, thereby suppressing the CI value to a low value.

In addition, the side electrode 46 is led to the principal surface 60d and the side surface 60c of the widening portion 60. Accordingly, as illustrated in FIG. 5 which is a partial view illustrating the periphery of a root of the vibration arm 35, when the electrode of the principal surface (front/rear surface) of the sidewall 35a of the vibration arm 35 is not accurately formed or when the electrode of the principal surface of the sidewall 35a is never formed, although the connection electrode 48 of the base 51 and the electrode of the principal surface of the sidewall 35a of the vibration arm 35 do not come into contact with each other, the side electrode 46 and the connection electrode 48 on the base 51 are electrically connected to each other through the electrode led to the principal surface 60d and the side electrode 60c of the widening portion 60, thereby avoiding the disconnection.

In addition, since the side electrode 46 and the connection electrode 48 on the base 51 can be connected to each other without paying attention to the electrode of the principal surface of the sidewall 35a of the vibration arm 35, the width of the electrode of the principal surface of the sidewall 35a of the vibration arm 35 may be decreased or the electrode of the principal surface of the sidewall 35a of the vibration arm 35 may not be formed. Accordingly, it is possible to prevent the electrode of the principal surface of the sidewall 35a of the vibration arm 35 from coming into contact with the inner electrode 44 in the elongate groove 33.

Figure 6:
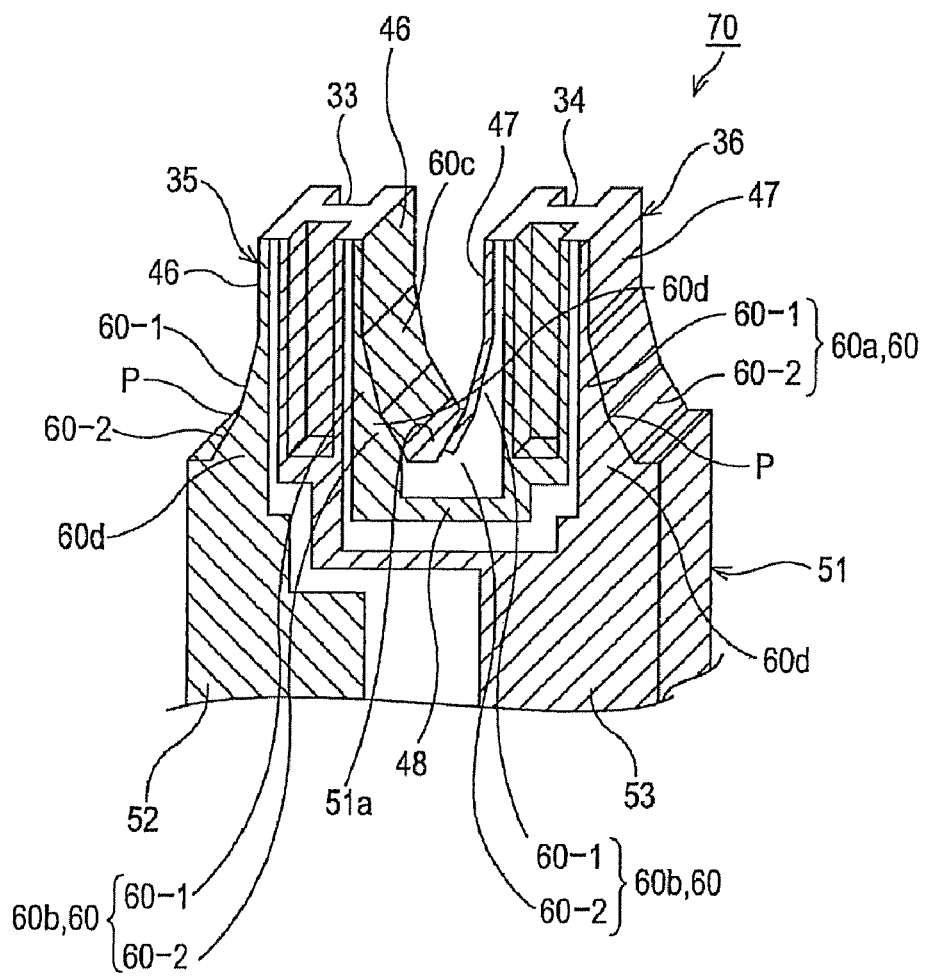
FIG. 6 is a partial enlarged view illustrating the periphery of a joint between vibration arms of a piezoelectric vibration piece according to a modified example of the invention.
Figure 7:
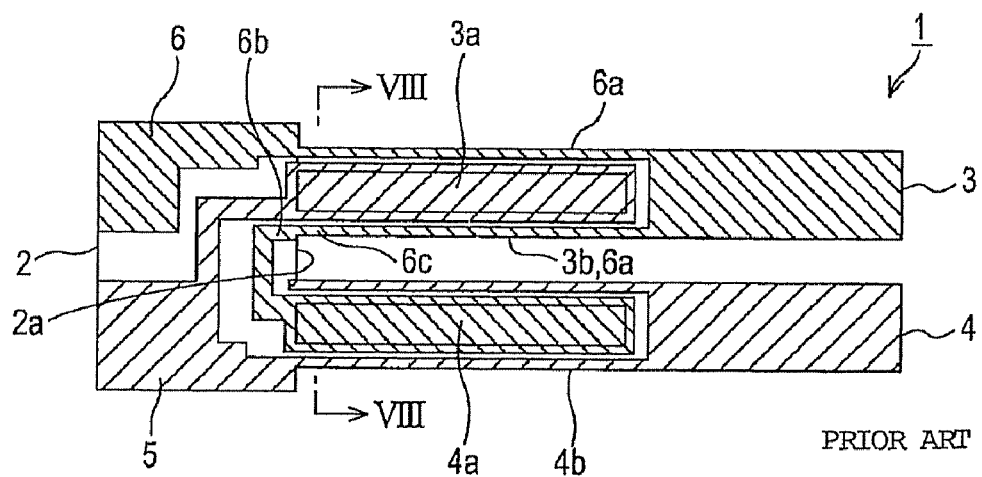
FIG. 7 is a schematic plan view illustrating an example of a piezoelectric vibration piece which has been conventionally used in a piezoelectric device.
Figure 8:
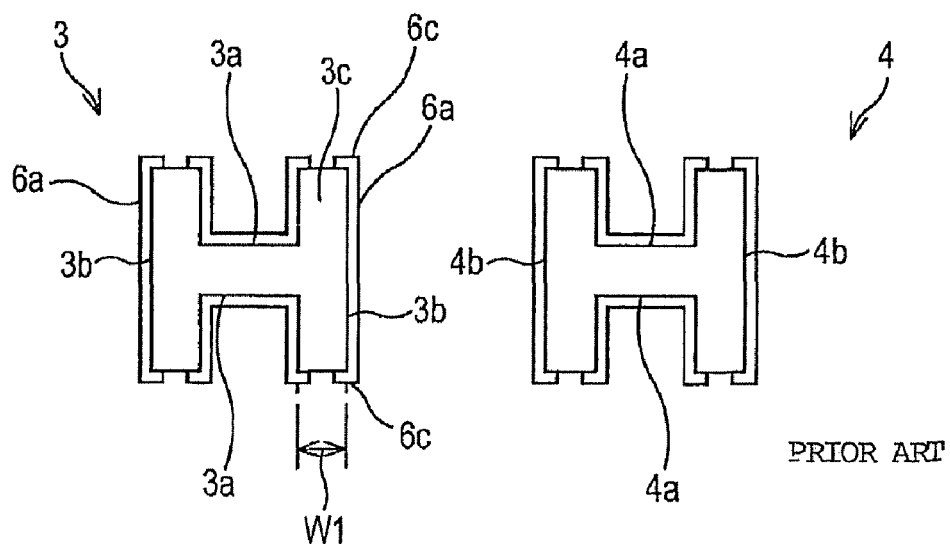
FIG. 8 is a schematic cross-sectional view taken along line A-A of FIG. 7.
Figure 9:
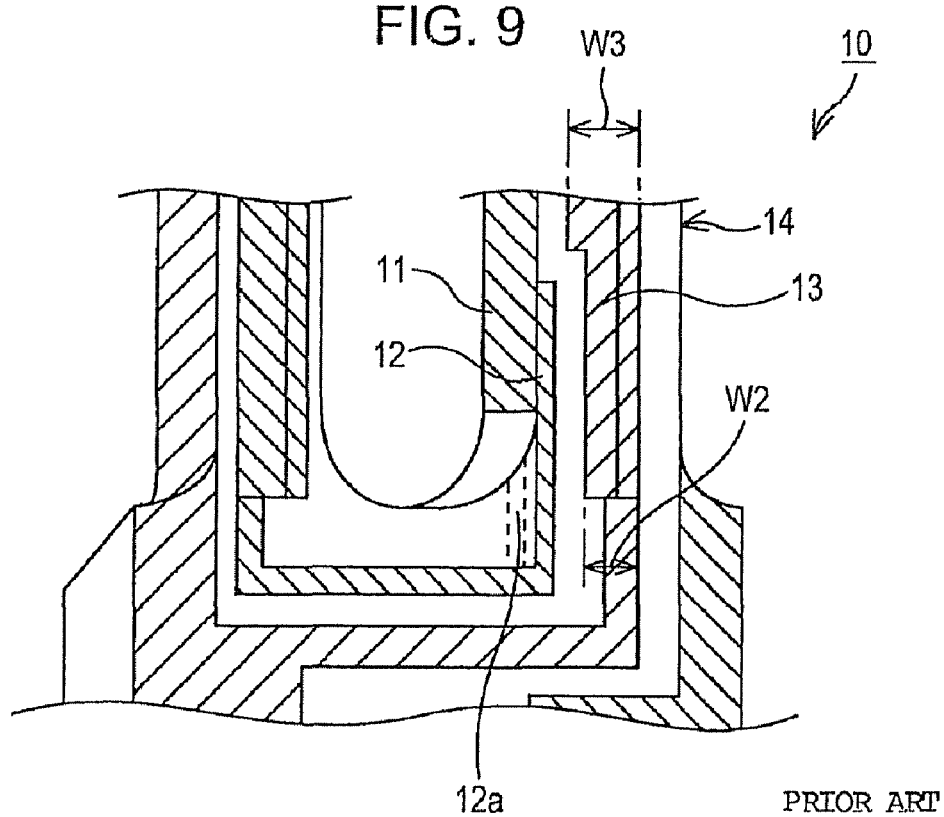
FIG. 9 is a partial enlarged view illustrating the periphery of a root of a vibration arm.

FIG. 6 is a partial enlarged view illustrating the periphery of a joint between vibration arms of a piezoelectric vibration piece according to a modified example of the invention.

In FIG. 6, the same reference numerals as those of the piezoelectric vibration piece 32 illustrated in FIGS. 1 to 5 are common elements and thus their description will be omitted. Hereinafter, portions different from those of the piezoelectric vibration piece 32 illustrated in FIGS. 1 to 5 will be described.

In FIG. 6, a piezoelectric vibration piece 70 is different from the piezoelectric vibration piece 32 illustrated in FIGS. 1 to 5 in the shape of the widening portions 60.

In other words, in the piezoelectric vibration piece 70 illustrated in FIG. 6, the widths of the widening portions 60, 60, 60, and 60 are widened toward the base 51 while a widening degree is changed step by step. In other words, each widening portion 60 is formed to have a change point P for changing an angle when viewed in a plan view.

More preferably, in each widening portion 60, the widening degree of a widening portion 60-2 at the base side is greater than that of a widening portion 60-1 at the front end side. Accordingly, larger stress is applied and rigidity of the joint of the base side in which distortion increases can increase.

In addition, although, in the modified example of FIG. 6, the widening degree of each widening portion 60 is changed by one step and the widening portions 60-1 and 60-2 having two different angles are formed when viewed in the plan view, the widening degree may be changed by at least two steps.

The modified example of the invention is configured as mentioned above and the width of the widening portion 60 is widened toward the base 51 while the widening degree is changed step by step, the contact length between the side surface 60c of the widening portion 60 and the principal surface 60d of the widening portion 60 can more increase, compared with a case where the widening degree is not changed. Accordingly, it is possible to more easily prevent disconnection between the side surface 60c of the widening portion 60 and the principal surface 60d of the widening portion 60, compared with the piezoelectric vibration piece 32 illustrated in FIGS. 1 to 5.

The invention is not limited to the above-mentioned embodiments. The configurations of the embodiments may be combined to each other or omitted and may be combined with another configuration.

For example, the piezoelectric vibration piece 70 illustrated in FIG. 6 may be received in the package 37 illustrated in FIGS. 1 and 2 to form a piezoelectric device. In addition, the package is not limited to a box-shaped package and may be, for example, a cylindrical container.

Moreover, even in the piezoelectric vibration piece, although the base 51 is bonded to the package 37 in FIGS. 1 to 6, the invention is not limited to this. For example, unlike the vibration arms 35 and 36, a second arm portion may extend from an end of the base 51 and be bonded to the package.

The entire disclosure of Japanese Patent Application No. 2005-81501, filed Mar. 22, 2005 is expressly incorporated by reference herein.

What is claimed is:

1. A piezoelectric vibration piece comprising:
    a base made of a piezoelectric material;
    a first and second vibration arms integrally formed with the base;
    elongate grooves formed along longitudinal directions of the first and second vibration arms in principal surfaces of the first and second vibration arms;
    inner electrodes disposed in the elongate grooves;
    side electrodes disposed on side surfaces of the first and second vibration arms;
    wherein widening portions being formed at a junction of the first and second vibration arms and the base;
    wherein each of the widening portions includes an inner widening portion located adjacent to a crotch portion between the first vibration arm and the second vibration arm;
    wherein a width of an at least one of the inner widening portions being widened toward the base while a widening degree is changed at a change point;
    wherein the side electrode formed on a tip side of at least one of the first and second vibration arms from the at least one of the inner widening portions being not led to the principal surface located between at least one of the elongate groove and at least one of the side surface; and
    wherein the side electrode formed on the at least one of the inner widening portions being led to the principal surface and the side surface of at least one of the first and second vibration arms at the inner widening portion and covers the change point.

2. A piezoelectric vibration piece according to claim 1,
    wherein the at least one of the inner widening portions includes a plurality of straight lines that are connected to each other.

3. A piezoelectric vibration piece according to claim 1,
    wherein a width of each elongate groove being constant along an entire length of each groove.

4. A piezoelectric vibration piece according to claim 1,
    wherein a connecting electrode formed on the base; and
    wherein the at least one of the side electrodes led to the principal surface and the side surface of at least one of the first and second vibration arms at the inner widening portion being connected to the at least one of the inner electrode of the second vibration arm through the connecting electrode.

5. A piezoelectric vibration piece according to claim 1,
wherein each of the widening portions includes an outer widening portion located outside between a first imaginary line along the longitudinal direction passing through a center of the first vibration arm in a width direction and a second imaginary line along the longitudinal direction passing through a center of the second vibration arm in the width direction; and
wherein at least part of the elongate grooves being formed between the inner widening portions and the outer widening portions.

6. A piezoelectric device which receives a piezoelectric vibration piece in a package or a case, the piezoelectric vibration piece comprising:
a base made of a piezoelectric material;
a first and second vibration arms integrally formed with the base;
elongate grooves formed along longitudinal directions of the first and second vibration arms in principal surfaces of the first and second vibration arms;
inner electrodes disposed in the elongate grooves;
side electrodes disposed on side surfaces of the first and second vibration arms;
wherein widening portions being formed at a junction of the first and second vibration arms and the base;
wherein each of the widening portions includes an inner widening portion located adjacent to a crotch portion between the first vibration arm and the second vibration arm;
wherein a width of an at least one of the inner widening portions being widened toward the base while a widening degree is changed at a change point;
wherein the side electrode formed on a tip side of at least one of the first and second vibration arms from the at least one of the inner widening portions being not led to the principal surface located between at least one of the elongate groove and at least one of the side surface; and
wherein the side electrode formed on the at least one of the inner widening portions being led to the principal surface and the side surface of at least one of the first and second vibration arms at the inner widening portion and covers the change point.

* * * * *